United States Patent [19]
Tanino

[11] Patent Number: 5,338,989
[45] Date of Patent: Aug. 16, 1994

[54] MICROWAVE INTEGRATED CIRCUIT

[75] Inventor: Noriyuki Tanino, Itami, Japan

[73] Assignee: Mitsubishi Denki Kabushiki Kaisha, Tokyo, Japan

[21] Appl. No.: 627,979

[22] Filed: Dec. 17, 1990

[30] Foreign Application Priority Data

Dec. 18, 1989 [JP] Japan .................. 1-329325
Jun. 29, 1990 [JP] Japan .................. 2-173183

[51] Int. Cl.⁵ .................. H03K 17/687; H03K 3/353; H03K 3/01; G06G 7/10
[52] U.S. Cl. .................. 307/571; 307/304; 307/491; 307/296.1
[58] Field of Search .............. 330/277, 296, 257, 286; 307/304, 303, 491, 296.1, 296.2, 296.8; 333/32, 33

[56] References Cited

U.S. PATENT DOCUMENTS

| | | | |
|---|---|---|---|
| 4,011,518 | 3/1977 | Irvine et al. | 330/277 |
| 4,189,682 | 2/1980 | Sechi | 330/277 |
| 4,476,446 | 10/1984 | Blight | 333/32 |
| 4,500,848 | 2/1985 | Harchand et al. | 330/277 |
| 4,504,796 | 3/1985 | Igarashi | 330/277 |
| 4,996,504 | 2/1991 | Huber et al. | 333/32 |

FOREIGN PATENT DOCUMENTS 1250309 11/1989 Japan .
2274006 11/1990 Japan .

OTHER PUBLICATIONS

Fukuda et al. "A New Microwave Amplitude Limiter Using GaAs FETs" Jan. 1978, pp. 61–66 (330-277).
IEEE 1987 Microwave and Millimeter-Wave Monolithic Circuits Symposium. Pp. 23–26; Sun & et al., "A Low Current, High Gain Monolithic Amplifier Covering 5–20 GHz Bandwidth"*FIG. 1*, *p. 23, column 1, line 33–column 2 line 53*.
IEEE MTT-S International Microwave Symposium Digest 1983, May 1983, Boston, Mass., pp. 145–147; Watkins et al. "A 60 GHz FET Amplifier"; *FIG. 4* *p. 146, column 1, line 10–line 18*.
Electronic Letters, vol. 20, No. 21, Oct. 11, 1984, Staines Meddelsex, Great-Britain, pp. 898–899; Esfandiari et al.
"Novel GaAs Monolithic Multistage X-Ku Band Amplifier"; *FIG. 1*, p. 898, *column 2, line 9–p. 899, column 1, line 15*.

Primary Examiner—Curtis Kuntz
Assistant Examiner—Sinh Tran
Attorney, Agent, or Firm—Leydig, Voit & Mayer

[57] ABSTRACT

A microwave integrated circuit comprises a first field effect transistor (FET) whose source is grounded via a capacitor and is connected to a source bias constant current source and to the drains of second field effect transistors whose gates are connected to a voltage power supply, an input matching circuit which is connected between the gate of the first FET and an input terminal, and an output matching circuit which is connected between the drain of the first FET and an output terminal. A drain current of the first FET having an almost constant value flows independent of variations in the direct current transistor characteristics and a rapid switching response is obtained when the first FET is driven on or off by a pulse.

10 Claims, 4 Drawing Sheets

MICROWAVE INTEGRATED CIRCUIT

FIELD OF THE INVENTION

The present invention relates to a semiconductor integrated circuit for high frequency signal such as microwave signal.

BACKGROUND OF THE INVENTION

FIG. 4 is a diagram showing a single stage amplifier circuit as an example of a prior art microwave integrated circuit. In FIG. 4, reference numeral 1 designates a field effect transistor(FET). An input matching circuit 4 is constituted by microwave lines 42, 43, and 44, capacitors 41, 46, and 47, and a resistor 45 and is connected between the gate of the FET 1 and an RF(radio frequency) signal input terminal 2. The capacitor 41 and the microwave lines 42 and 43 are connected in series and are provided between the RF signal input terminal 9, and the gate of the FET 1. A node between the microwave lines 42 and 43 is connected with a gate bias terminal 21 via the microwave line 44 and the resistor 45. The ends of the resistor 45 are grounded via the capacitors 46 and 47, respectively. An output matching circuit 5 is constituted by microwave lines 51, 52, and 54, and capacitors 53 and 55 and is connected between the drain of the FET 1 and an RF signal output terminal 3. The capacitor 53 and the microwave lines 51 and 52 are connected in series and are provided between the drain of the FET 1 and the RF signal output terminal 3. A node between the microwave lines 51 and 52 is grounded via the microwave line 54 and the capacitor 55. A node between the microwave line 54 and the capacitor 55 is connected to a drain bias terminal 8. The gate bias terminal 21 is connected to a ground terminal 7 via an external gate bias voltage power supply 22 while the drain bias terminal 8 is connected to the ground terminal 7 via an external drain bias voltage power supply 10.

Next, a description will be given of the operation.

When a proper gate bias voltage is applied from the external gate bias voltage power supply 22, the amplifier circuit is driven by a drain current flowing from the external drain bias voltage power supply 10 to the FET 1 via the drain bias terminal 8 and the microwave lines 54 and 51. An RF input signal supplied to the RF signal input terminal 2 in this operating state is amplified by the operation of source grounded FET 1 and is output from the RF signal output terminal 3. The resistor 45 and the capacitors 46 and 47 constitute a low-pass filter for preventing the FET 1 from oscillating. The resistor 45 also functions to prevent a surge voltage breakdown of the gate of the FET 1.

In the prior art microwave integrated circuit constructed as described above, the drain current varies depending on variations in the pinch off voltage of the FET 1. Therefore, it is necessary to adjust the gate bias voltage and if it is not adjusted, such as 1 dB compression point output $P_{1dB}$, power gain, voltage standing wave ratio (VSWR), and power consumption vary.

In addition, a short stub is used as a microwave line to reduce the chip size and a capacitor having large capacitance is used as the capacitor 47 in a monolithic microwave integrated circuit (hereinafter referred to as "MMIC"). For this reason, a large capacitance exists at the gate bias terminal 21. Therefore, the switching response of FET 1 is delayed when the FET 1 is driven on or off by a pulse signal such as a radar signal.

SUMMARY OF THE INVENTION

The present invention is directed to solving the above described problems and has for its object to provide a microwave integrated circuit capable of adjusting the drain current flowing in an FET such that the value of drain current is independent of variations in the characteristics of the FET and capable of performing a rapid switching response.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a microwave integrated circuit comprises a field effect transistor, an input matching circuit connected between the gate of the field effect transistor and an input terminal, and an output matching circuit connected between the drain of the field effect transistor and an output terminal, wherein the gate of the field effect transistor is grounded via a microwave line or a resistor while the source is grounded via a capacitor as well as being connected to a source bias constant current source. Therefore, the FET operates as a source grounded FET at microwave frequencies, and a drain current having an almost constant value determined by the source bias constant current source flows independent of variations in the FET characteristics with respect to direct current, whereby a self bias is applied between the gate and the source in accordance with variations in the pinch off voltage of the FET.

According to a second aspect of the present invention, a microwave integrated circuit comprises a first field effect transistor (FET), an input matching circuit connected between the gate of the first FET and an input terminal, an output matching circuit connected between the drain of the first FET and an output terminal, and a second FET whose drain is connected to the source of the first FET, wherein the gate of the first FET is connected to a first voltage power supply while the source thereof is grounded via a capacitor, and a gate of the second FET is connected to a second voltage power supply while the source thereof is connected to a third voltage power supply. Therefore, the variation in the drain current of the first FET can be reduced and a rapid switching response is obtained when the FET is driven on or off by a pulse signal.

According to a third aspect of the present invention, a microwave integrated circuit comprises the above-described second FET comprises a least two FETs whose gates, sources, and drains are respectively connected in common, and the source wiring or the drain wiring of some of those field effect transistors is several as needed in a fabrication process of integrated circuit. Therefore, the drain current flowing through the second FET can be adjusted during fabrication of the circuit, by means of which the drain current of the first FET connected in series to the second FET can be adjusted. As a result, variations the characteristics of the first FET in the fabrication process can be compensated for the variation without using an external circuit.

DETAILED DESCRIPTION OF THE PREFERRED EMBODIMENT

Embodiments of the present invention will be described in detail with reference to the drawings.

Figure 1:
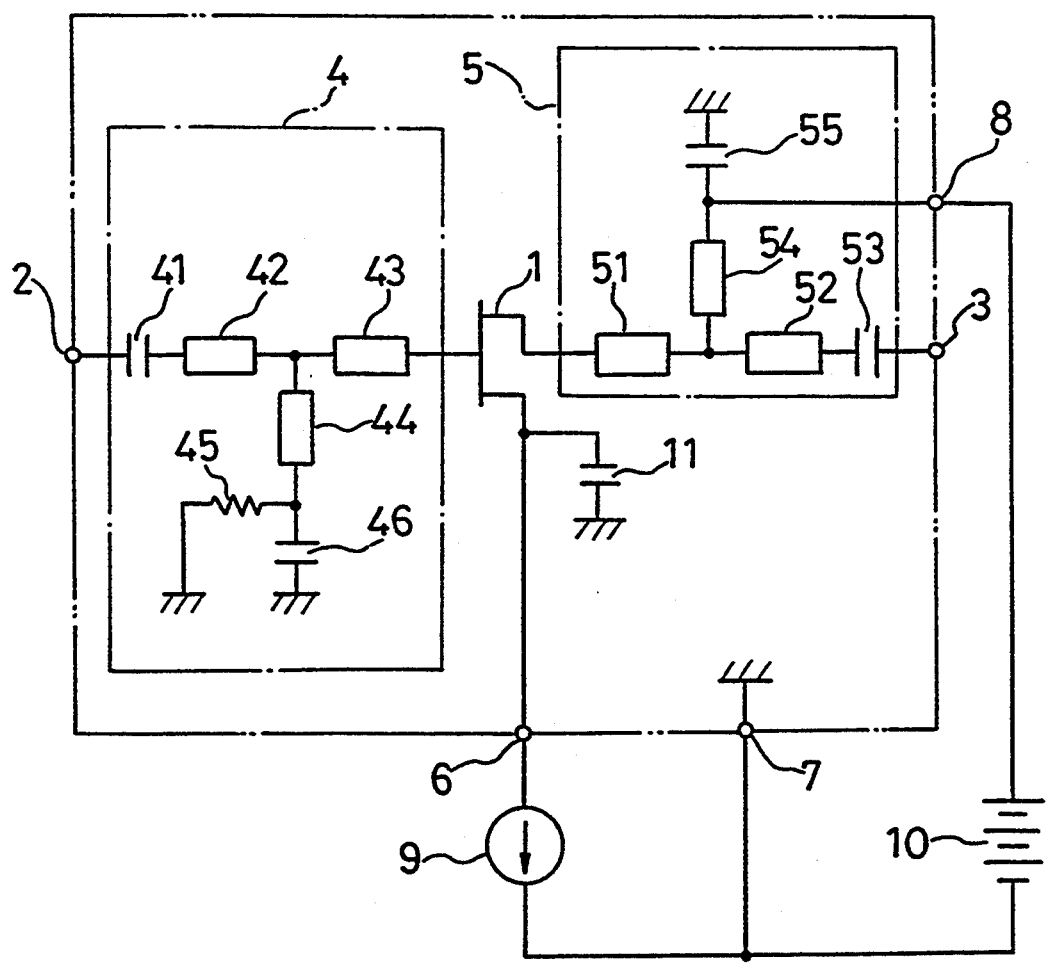
FIG. 1 is a circuit diagram showing a construction of a microwave integrated circuit in accordance with a first embodiment of the present invention.

FIG. 1 is a circuit diagram showing a construction of a microwave integrated circuit in accordance with a first embodiment of the present invention. In FIG. 1, the same reference numerals as those of FIG. 4 designate the same parts. Reference numeral 6 designates a source bias terminal, reference numeral 9 designates an external source bias constant current source, and reference numeral 11 designates a capacitor.

An input matching circuit 4 includes by capacitors 41 and 46, microwave lines 42, 43, and 44, and a resistor 45 and is connected between an RF signal input terminal 2 and the gate of an FET 1. The capacitor 41 and the microwave lines 42 and 43 are connected in series between the input terminal 2 and gate of the FET 1. A node between the microwave lines 42 and 43 is grounded via the microwave line 44 and the capacitor 46. The resistor 45 is connected between ground terminal and a node between the microwave line 44 and the capacitor 46. The source of the FET 1 is connected to a source bias terminal 6 as well as being grounded via a capacitor 11. The source bias terminal 6 is connected to a ground terminal 7 via an external source bias constant current source 9. The construction of other parts is the same as that of the prior art microwave circuit of FIG. 4.

Next, a description will be given of the operation.

The gate of the FET 1 is grounded via the microwave lines 43 and 44 and the resistor 45, the source thereof is connected to the external source bias constant current source 9 via the source bias terminal 6, and the drain thereof is connected to the external drain bias constant voltage power supply 10 via the drain bias terminal 8 with respect to direct current. Therefore, a drain current having the same value as that of the external source bias constant current source 9 which is connected to the source of the FET 1 flows through the FET 1.

Accordingly, the circuit constructed as described above has constant 1 dB compression point outputs $P_{1dB}$ and constant power consumption independent of variations in the characteristics of the FET 1. Input and output impedances of the FET 1 do not vary so much in a case where the drain current keeps a constant value even if the pinch off voltage varies, whereby there is less distortion in the input and output matching, and variations in the gain and the voltage standing wave ratio are low. Furthermore, when the FET 1 is driven on or off by a pulse signal such as a radar signal, a rapid switching response is obtained because the FET 1 is driven by the external source bias constant current source 9 which is connected to the source of the FET 1.

Figure 4:
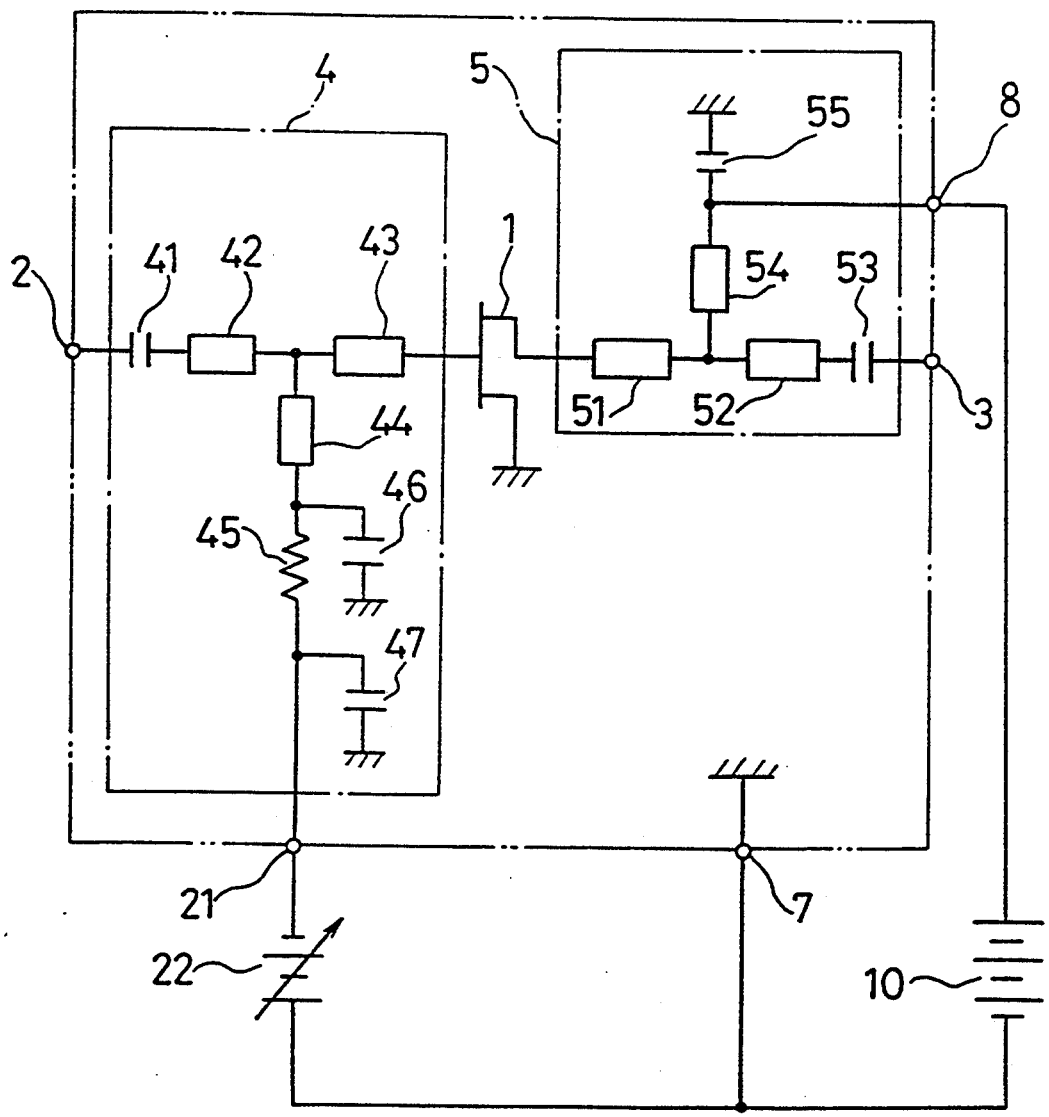
FIG. 4 is a circuit diagram showing a construction of a prior art microwave integrated circuit.

On the other hand, since the source of the FET 1 is grounded with respect to microwave frequency signals, the FET 1 has a similar construction as the prior art microwave integrated circuit of FIG. 4.

Figure 2:
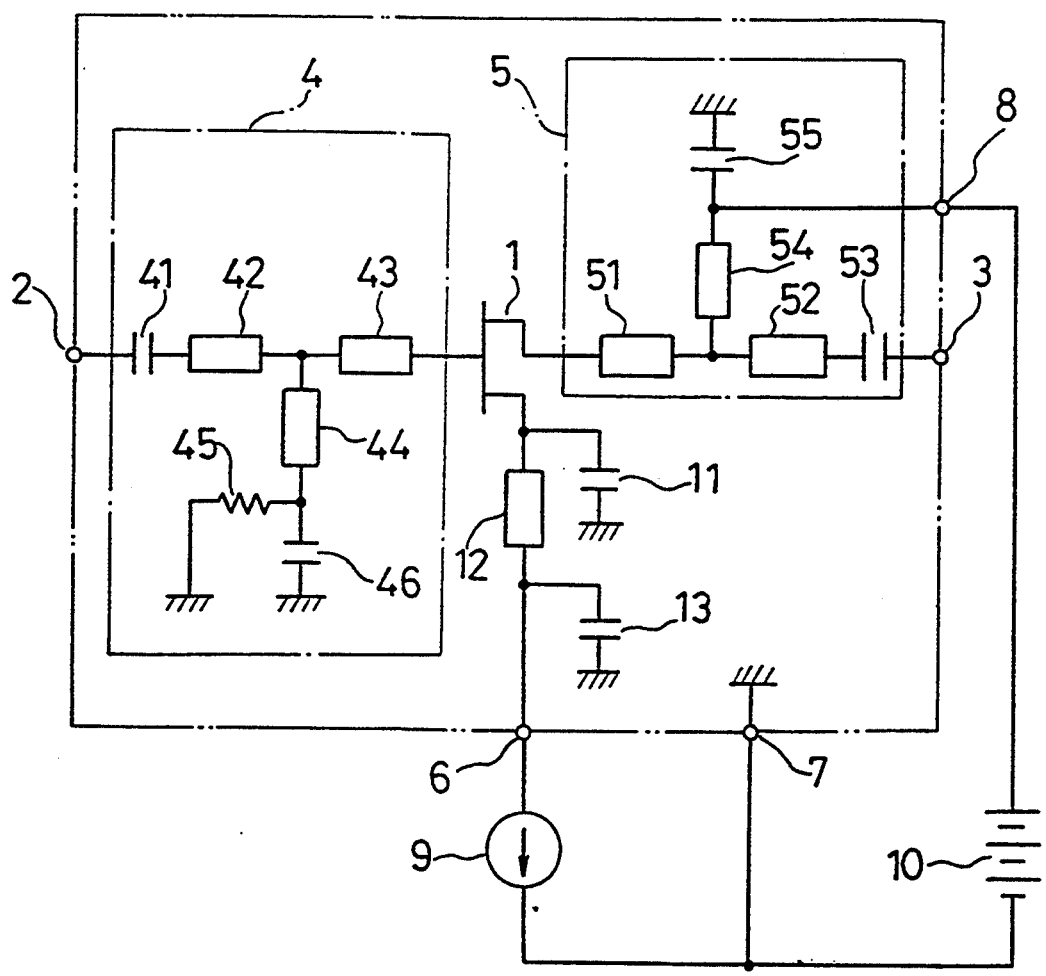
FIG. 2 is a circuit diagram showing a construction of a microwave integrated circuit in accordance with a second embodiment of the present invention.

FIG. 2 is a circuit diagram showing a microwave integrated circuit in accordance with a second embodiment of the present invention. In FIG. 2, the same reference numerals as those of FIG. 1 designate the same parts. Reference numeral 12 designates a one fourth wavelength line. Reference numeral 13 designates a capacitor which is connected between an end of the one fourth wavelength line 12 and a ground terminal. The other parts are the same as those of the microwave integrated circuit of FIG. 1.

With respect to of direct current, the FET 1 of FIG. 2 is equivalent to that of the microwave integrated circuit of FIG. 1 since the one fourth wavelength line 12 is only inserted between the source of the FET 1 and the source bias terminal 6.

However, with respect to microwave frequency signals, the FET 1 is not influenced by the external source bias constant current source 9 which is connected to the source bias terminal 0 and by the current source wiring because the impedance of the one fourth wavelength line 12 is sufficiently larger than that of the capacitor 11, which is connected to the source of the FET 1, and because of the capacitors 11 and 13 which are connected to the ends of the one fourth wavelength line 12. Therefore, the feedback (isolation) from the drain of the FET 1 to the gate thereof becomes constant and independent of its constant current source 9 and the wiring, thereby enabling the FET 1 to perform stable amplification.

In the above-described embodiments, since the resistor 45 is used for grounding the gate of the FET 1, it is possible to prevent the circuit from oscillating and to prevent surge voltage breakdown of the gate. The microwave line 44 can be grounded directly without using the resistor 45 and the capacitor 46, thereby resulting in the same operation.

In the above-described embodiments, a constant current source is used for obtaining a constant drain current but a second FET through which a constant drain current flows can be used. An embodiment having the second FET will be described hereinafter.

Figure 3:
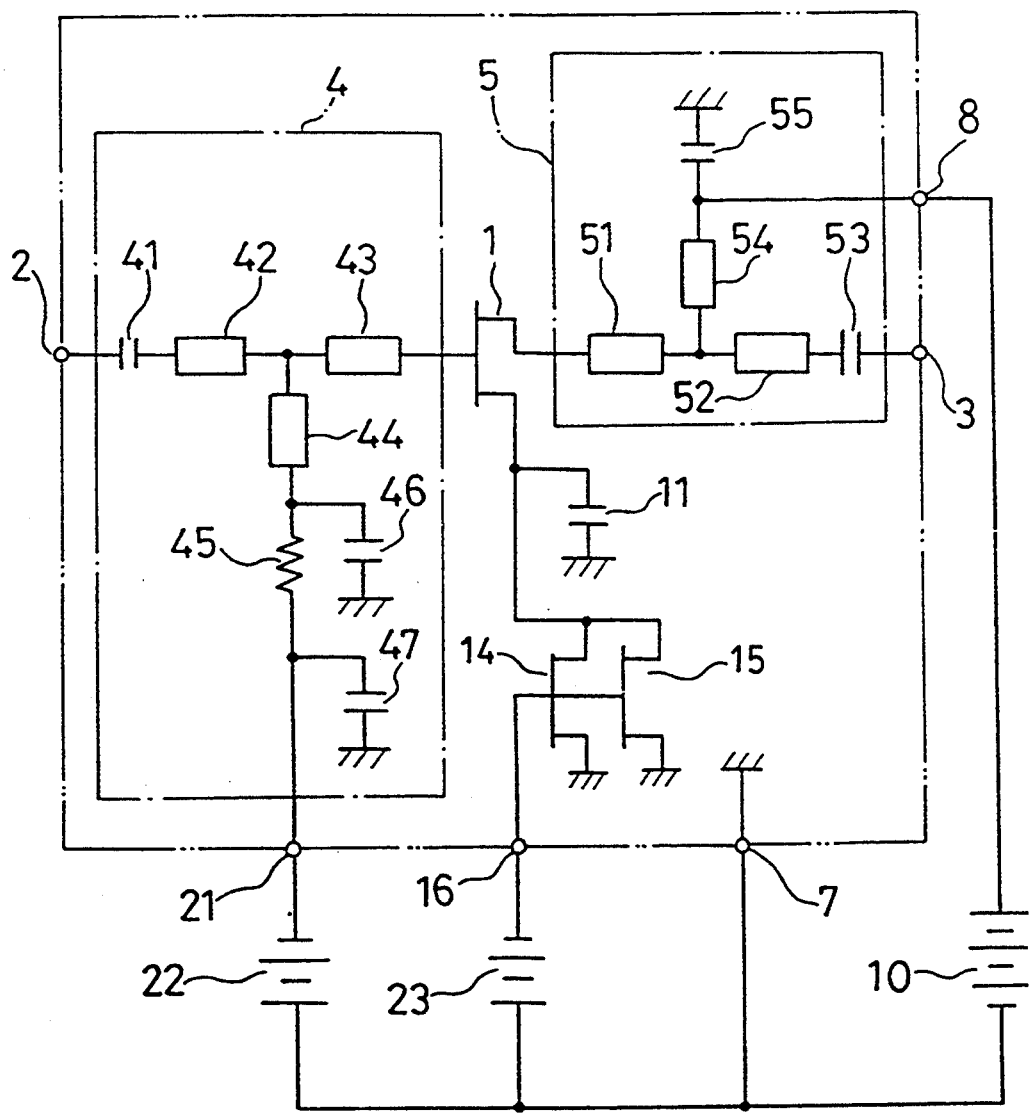
FIG. 3 is a circuit diagram showing a construction of a microwave integrated circuit in accordance with a third embodiment of the present invention.

FIG. 3 is a circuit diagram showing a construction of a microwave integrated circuit using second FETs in accordance with a third embodiment of the present invention. A single stage amplifier circuit is employed in this embodiment similarly as in the prior art. In FIG. 3, the same reference numerals as those of FIGS. 1, 2, and 4 designate the same or corresponding parts. The source of the FET 1 is grounded via a capacitor 11. Each drain of second FETs 14 and 15 is connected to the source of the FET 1. Reference numeral 23 designates a gate bias constant voltage power supply for the FETs 14 and 15.

The source of the FET 1 is grounded via the capacitor 11 and is connected to the drains of the FETs 12 and 13. The gates of the FETs 14 and 15 are connected to the ground terminal 7 via the external gate bias voltage power supply 23 which is connected to the gate bias terminal 16. The sources of the FETs 14 and 15 are grounded. The construction of the other parts is the same as that of the microwave integrated circuit of FIG. 4.

A description will be given of the operation.

With respect to direct current, since the gate of the FET 1 is connected to the external gate bias voltage power supply 22 via microwave lines 43 and 44, a resistor 45, and a gate bias terminal 21 and the drain thereof is connected to an external drain bias voltage power supply 10 via a drain bias terminal 8, the drain current has the same value as that flowing through the FETs 14 and 15 which are connected to the source of the FET 1. Since the gates of the FETs 14 and 15 are connected to the external gate bias voltage power supply 23 via the gate bias terminal 6 while the sources thereof are grounded, a drain current having a constant value flows through the FETs 14 and 15. Here, the FET 1 is driven by microwave signals and its gate length is made as short as possible to obtain a high gain and a high noise figure, so there is a large variation in the drain current due to variations arising in the fabrication process. On the other hand, since the FETs 14 and 15 can be operated by direct current, it is not necessary to shorten their gate lengths, thereby reducing the variation in the drain current due to variations arising in the fabrication process. Accordingly, the variation in the drain current flowing through the FET 1 can be reduced to the extent of reduction of variations in the drain current flowing through the FETs 14 and 15.

Furthermore, the value of the drain current flowing through the FETs 14 and 15 can be adjusted by securing the connecting wiring of the drain or the source of either FET 14 or 15, such as by laser irradiation, in accordance with variation in the drain current flowing through the FETs 14 and 15, whereby the drain current of the FET 1 can be established at a target value.

Accordingly, the circuit constructed as described above can obtain a constant 1 dB compression point output $P_{1dB}$ and a constant power consumption independent of variation in the characteristics of the FET 1. Input and output impedances of the FET 1 do not vary so much in a case where the drain current is constant even if the pinch off voltage of FET 1 varies. Therefore, there is less distortion due to input and output matching and the variations in the gain and the voltage standing wave ratio are reduced.

Furthermore, when the FET 1 is driven on or off by a pulse signal such as a radar signal, the FET 1 is driven via the FETs 14 and 15 which are connected to the source of the FET 1, whereby a rapid switching response is obtained.

On the other hand, with respect to microwave frequency signals, the source of FET 1 is grounded and it has the same construction as that of the microwave integrated circuit of FIG. 2.

In the above-illustrated embodiment, the FETs 14 and 15 comprise the second FETs connected to the source of the first FET 1 and the drain current can be adjusted by severing the wiring of the drain or the source of some of those second FETs. However, if the second FET comprises by only one FET, a rapid switching response can be realized by adjusting the drain current through an external circuit.

In the above-illustrated embodiment, two FETs such as FETs 14 and 15 comprise the second FETs which are connected to the source of the first FET 1, but a second FETs comprising three or more FETs can widen the adjustment range of the drain current and can increase the precision of adjustment. If the second FETs comprise by a plurality of FETs having different sizes, the value of drain current can be established with high precision by selecting which FET is to be cut off as is needed. For example, in a case where the second FET comprises by four FETs, there are fifteen ways of selecting the FETs to be cut off for obtaining a drain current having a desired value. While in the above-illustrated embodiment the sources of FETS 14 and 15 are grounded, they can be connected to a third voltage power supply.

Furthermore, in the above-illustrated embodiment, a single stage amplifier circuit is described, but an amplifier circuit having more than two stages can be constituted. The present invention is not limited to an amplifier circuit but it can be adopted in other circuits in which a source of an FET is grounded with respect to microwave frequency signals, for example, a mixer circuit which utilizes non-linear characteristics of FET, or an attenuator circuit, with the same effects as described above.

As is evident from the foregoing description, according the present invention, a microwave integrated circuit has a construction in which a source of a first FET is grounded via a capacitor and is connected to a source bias constant current source in which a constant drain current flows or to a drain of a second FET. Therefore, variations in the value of drain current can be reduced and a rapid switching response can be realized even in a case where the FETs are driven on or off by a pulse signal.

Furthermore, according to the present invention, a second FET comprises two or more FETs, whose gates, sources, and drains are respectively connected in common, and the source wiring or the drain wiring of some of those FETs can be cut off as needed in the fabrication process. Therefore, the drain current flowing through the second FET can be adjusted in the fabrication process of the circuit, by means of which the drain current flowing in the first FET which is connected to the second FET in series can be adjusted. As a result, the first FET can be compensated for the variations in the fabrication process without using an external circuit, and output power, gain, voltage standing wave ratio, power consumption can be made constant.

What is claimed is:

1. A microwave integrated circuit comprising:
   an input terminal for receiving an input signal;
   an output terminal for providing an output signal;
   a source bias constant current source;
   an input matching circuit including a first microwave line and
   a first resistor;
   a first capacitor;
   a field effect transistor comprising a gate grounded via said first microwave line and said first resistor, a source grounded via said first capacitor and connected to said source bias constant current source, and a rain;
   said input matching circuit being connected to said source of said field effect transistor and said input terminal;
   an output matching circuit connected between said drain of said field effect transistor and said output terminal; and
   a one-fourth wavelength line having first and second ends and a second capacitor connected the second end of said one-fourth wavelength line and ground, said first end being connected to said source of said field effect transistor and said second end being connected to said source bias constant current source.

2. A microwave integrated circuit as defined in claim 1 wherein said source bias constant current source is a predetermined external current source.

3. A microwave integrated circuit as defined in claim 1 comprising a bias terminal to which said source bias constant current source is connected.

4. A microwave integrated circuit comprising:
an input terminal for receiving an input signal;
an output terminal for providing an output signal;
a first capacitor;
first, second, and third voltage power supplies;
a first field effect transistor including a gate connected to said first voltage power supply, a source grounded via said first capacitor, and a drain connected to said third voltage power supply;
an input matching circuit connected between the gate of said first field effect transistor and said input terminal;
an output matching circuit connected between the drain of said first field effect transistor and said output terminal; and
a second field effect transistor means including a drain connected to the source of said first field effect transistor, a gate connected to said second voltage power supply, and a source which is grounded.

5. A microwave integrated circuit as defined in claim 4 wherein said second field effect transistor means comprises at least two field effect transistors whose gates, source, and drains are respectively connected in common and including source wiring and drain wiring that may be severed in the fabrication process.

6. A microwave integrated circuit as defined in claim 5, which further comprises bias terminals to which said first and said second voltage power supplies are connected.

7. A microwave integrated circuit as defined in claim 5 wherein said at least two field effect transistors are of different sizes.

8. A microwave integrated circuit as defined in claim 4 wherein said third voltage supply is grounded inside the microwave integrated circuit.

9. A microwave integrated circuit as defined in claim 4 wherein said third voltage power supply is a predetermined external voltage power supply.

10. A microwave integrated circuit as defined in claim 4 wherein said input matching circuit includes a first microwave line and a first resistor wherein said gate of said first field effect transistor is connected to said first voltage power supply via one of said first microwave line and said first resistor.

* * * * *

UNITED STATES PATENT AND TRADEMARK OFFICE
CERTIFICATE OF CORRECTION

PATENT NO. : 5,338,989

DATED : August 16, 1994

INVENTOR(S) : Tanino

It is certified that error appears in the above-identified patent and that said Letters Patent is hereby corrected as shown below:

Column 6, line 55, change "rain" to --drain--.

Signed and Sealed this

Eighth Day of November, 1994

Attest:

BRUCE LEHMAN

Attesting Officer     Commissioner of Patents and Trademarks